(12) United States Patent
Yokota

(10) Patent No.: US 7,573,333 B2
(45) Date of Patent: Aug. 11, 2009

(54) AMPLIFIER AND DRIVING CIRCUIT USING THE SAME

(75) Inventor: Junya Yokota, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/730,686

(22) Filed: Apr. 3, 2007

(65) Prior Publication Data

US 2007/0241817 A1    Oct. 18, 2007

(30) Foreign Application Priority Data

Apr. 4, 2006   (JP)   ............................. 2006-102932

(51) Int. Cl.
*H03F 3/26*   (2006.01)
*H03F 1/14*   (2006.01)

(52) U.S. Cl. ....................... 330/255; 330/292

(58) Field of Classification Search .................. 330/255, 330/292

See application file for complete search history.

(56) References Cited

U.S. PATENT DOCUMENTS 7,154,332 B2 * 12/2006 Tsuchi ....................... 330/255

FOREIGN PATENT DOCUMENTS

JP    2005-124120    5/2005

* cited by examiner

*Primary Examiner*—Steven J Mottola
(74) *Attorney, Agent, or Firm*—McGinn IP Law Group, PLLC

(57) ABSTRACT

An amplifier in an embodiment of the present invention has MOS transistors connected serially between a power supply VDD and a ground terminal GND; an output terminal Vout connected to a node provided between the MOS transistors; a first mirror capacity provided between the gate of a MOS transistor and the output terminal Vout; and a second mirror capacity provided between the gate of another MOS transistor and the output terminal Vout. The amplifier further includes a first switching circuit for connecting one end of the first mirror capacity to the power supply terminal VDD or to the gate of a MOS transistor; and a second switching circuit for connecting one end of the second mirror capacity to the ground terminal GND or to the gate of another MOS transistor.

19 Claims, 9 Drawing Sheets

FIG. 6

|     | a(POL) | b | c | d | e(POL) | f(POL) | g | h |
|-----|--------|---|---|---|--------|--------|---|---|
| (1) | 1 | 1 | 0 | 1 | 1 | 0 | 1 | 0 |
| (2) | 1 | 1 | 1 | 0 | 1 | 0 | 0 | 0 |
| (3) | 0 | 0 | 1 | 1 | 0 | 1 | 0 | 1 |
| (4) | 0 | 0 | 0 | 0 | 0 | 1 | 0 | 0 |

AMPLIFIER AND DRIVING CIRCUIT USING THE SAME

FIELD OF THE INVENTION

The present invention relates to an amplifier for driving a capacitive load such as a liquid crystal display and a driving circuit that uses the amplifier.

BACKGROUND OF THE INVENTION

Recently, flat panel displays such as liquid crystal displays have been considered to be important items more and more for the progress of the enhanced video and information oriented society and for the wide spread of multimedia systems. Because those liquid crystal displays have such merits as low power consumption, thin and light structure, etc., they are employed widely as displays of portable terminal devices, etc.

A liquid crystal display has a liquid crystal panel for displaying images and a driving circuit for driving the liquid crystal panel. An active matrix type liquid crystal panel has an element substrate, a counter substrate, and liquid crystal held between those substrates. On the element substrate are formed horizontal scanning lines and vertical data lines respectively. And plural pixel electrodes are formed like a matrix between those scanning and data lines. An active element such as a TFT (Thin Film Transistor) is provided around each node of those scanning and data lines. Each TFT gate electrode is connected to a scanning line, each source electrode is connected to a data line, and each drain electrode is connected to a pixel electrode respectively.

Common electrodes facing a pixel electrode are formed on the counter substrate. One end of a liquid crystal capacity, which is a capacitive load, is connected to a pixel electrode. The other end of the liquid crystal capacity is connected to a common electrode facing a pixel electrode formed on the counter substrate. Consequently, the liquid crystal capacity is connected equivalently to a TFT drain electrode.

A scanning line driving circuit is connected to the scanning lines and a data line driving circuit is connected to the data lines respectively. The scanning line driving circuit scans the scanning lines sequentially from up to down to enable the data line driving circuit to apply a voltage to each pixel electrode through a TFT. The common electrode driving circuit applies a proper voltage to each common electrode. This is why the liquid crystal is applied a voltage equivalent to a potential difference between the pixel electrode and the common electrode. The liquid crystal display changes such a voltage applied to the liquid crystal to change the ordering of the liquid crystal and changes the light transmittance to make a gradation display.

In the case of a known liquid crystal display, the polarity of a voltage applied to each pixel electrode from a data line through a TFT (hereinafter, to be referred to as a pixel voltage) is inverted at every predetermined period. By inverting the polarity of such a voltage applied to the liquid crystal to make AC driving, the degradation of the characteristics of the liquid crystal to be caused by DC driving is suppressed. As an AC driving method, for example, there is a well known dot inversion driving method, which inverts the polarity of the pixel voltage with respect to each pixel.

Generally, an operational amplifier subjected to voltage follower connection is used as an output circuit used as a driving circuit employed for a liquid crystal display. The frequency characteristic of the operational amplifier changes according to a change of the driving load condition. If the load frequency characteristic changes in the operational amplifier employed for a driving circuit, the operational amplifier comes to oscillate, thereby causing a trouble in the display of the liquid crystal panel.

There are some known methods for improving the frequency characteristic of the operational amplifier and one of the methods is phase compensation (hereinafter, to be referred to as mirror compensation) realized with use of a mirror capacity (e.g., Laid open Japanese application No. 2005-124120 A). FIG. 9 shows a configuration of a conventional driving circuit 10 described in the JP 2005-124120 A. As shown in FIG. 9, the conventional driving circuit 100 has an N receiving differential amplifier 101, a P receiving differential amplifier 102, and an AB class amplifying circuit 103. The driving circuit of the liquid crystal display described in the JP 2005-124120 A uses the AB class amplifier 103 for making mirror compensation for enabling Rail-to-Rail inputs/outputs.

The AB class amplification circuit 13 has a P channel MOS transistor 104 connected between an output terminal and a power supply terminal and an N receiving channel output MOS transistor 105 connected between the output terminal and a ground terminal. The gate of the P channel MOS transistor 104 is connected to an output line of the N receiving differential amplifier 101. The gate of the N channel MOS transistor 105 is connected to an output line of the P receiving differential amplifier 105. In the AB class output circuit 103, a pair of mirror capacities 106 and 107 for phase compensation are connected between the gate of each of a pair of P channel MOS transistors 104 and an output terminal Vout and between the gate of each of a pair of N channel output MOS transistors 105 and the output terminal Vout respectively.

This pair of mirror capacities 106 and 107 is effective to improve the frequency characteristic of the differential type AB amplifier 1. In this case, the larger the mirror capacity, which is assumed to be a phase compensation capacity, is, the more the frequency characteristic is improved.

If a driving circuit including an operational amplifier for mirror compensation, which enables Rail-to-Rail inputs/outputs, is used for the AC driving that inverts the voltage polarity alternately just like the above described dot inversion driving method, the following cases will arise in each polarity inversion, thereby the through-current increases. As a result, the through-rate of the operational amplifier is lowered. This has been a conventional problem.

(1) When Polarity Output is Inverted from Positive to Negative

If the polarity of the polarity inverted signal is inverted from positive to negative, the gate voltage rises at each of the P channel MOS transistor 104 and the N channel MOS transistor 105. As a result, the ON resistance of the P channel MOS transistor 104 rises while the ON resistance of the N channel MOS transistor 105 falls, then the Vout falls. At the moment when the polarity of this Vout is inverted from positive to negative, the Vout makes a voltage fall suddenly, thereby the charge goes to the mirror capacity 106. Consequently, the gate voltage of the P channel MOS transistor 104 falls and its ON resistance is delayed to rise. Therefore, at such a polarity inversion from positive to negative, the ON resistance of both P channel MOS transistor 104 and N channel MOS transistor 105 is lowered at the same time in a period, in which a large through-current comes to flow.

(2) When Polarity Output is Inverted from Negative to Positive

If the polarity of the polarity inverted signal is inverted from negative to positive, the gate voltage falls at both the P channel MOS transistor 104 and the N channel MOS transistor 105. As a result, the ON resistance of the P channel MOS transistor 104 falls while the ON resistance of the N channel MOS transistor 105 rises, then the Vout rises. At the moment when the polarity of this Vout is inverted from negative to positive, the Vout makes a voltage rise suddenly, thereby the charge goes to the mirror capacity 106. Consequently, the gate voltage of the N channel MOS transistor 105 rises and its ON resistance is delayed to rise. Therefore, even at such a polarity inverted output from negative to positive, the ON resistance of both P channel MOS transistor 104 and N channel MOS transistor 105 is lowered at the same time in a period, in which a large through-current comes to flow.

If AC driving is adopted for a liquid crystal panel such way, the operational amplifier in the driving circuit keeps inverting the output voltage to drive the liquid crystal, which is a capacitive load. In that case, each time the output voltage polarity is inverted, the output voltage comes to amplitude significantly. And to obtain a desired output voltage when the output voltage polarity is inverted, the ON resistance of one of the transistors 104 and 105 is lowered and the ON resistance of the other transistor is raised. In the case of the conventional mirror compensation, the output of the operational amplifier comes to affect the gate of each output transistor due to the mirror capacity. Consequently, the mirror capacity causes a delay of the rising of the ON resistance of the transistor that is expected to increase the ON resistance to limit the output. As a result, the ON resistance of both transistors 104 and 105 falls at the same time in a period, thereby the through-current increases and the through rate of the operational amplifier is lowered. And such an increase of the through-current causes heat generation and EMI (Electro-Magnetic Interference) in chips.

SUMMARY

In one aspect of the amplifier of the present invention, the amplifier has first and second output transistors connected serially between a first power supply potential and a second power supply potential; an output terminal connected to a node between the first and second transistors; a first capacity element provided between a control terminal of the first transistor and the output terminal; a second capacity element provided between a control terminal of the second transistor and the output terminal; a first switching circuit for connecting one end of the first capacity element to the first power supply potential or to the control terminal of the first transistor; and a second switching circuit for connecting one end of the second capacity element to the second power supply potential or to the control terminal of the second transistor.

With such a configuration, each switching circuit comes to able to disconnect a phase compensation capacity from the gate of each output transistor at a large change of an output voltage. Consequently, the ON resistance of an output transistor disconnected from a phase compensation capacity is prevented from lowering, thereby the through current can be reduced. This is why the through-rate of the operational amplifier can be suppressed effectively.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 is another diagram for describing the operation of the driving circuit in the first embodiment;

DETAILED DESCRIPTION OF THE PREFERRED EMBODIMENTS

First Embodiment

Figure 1:
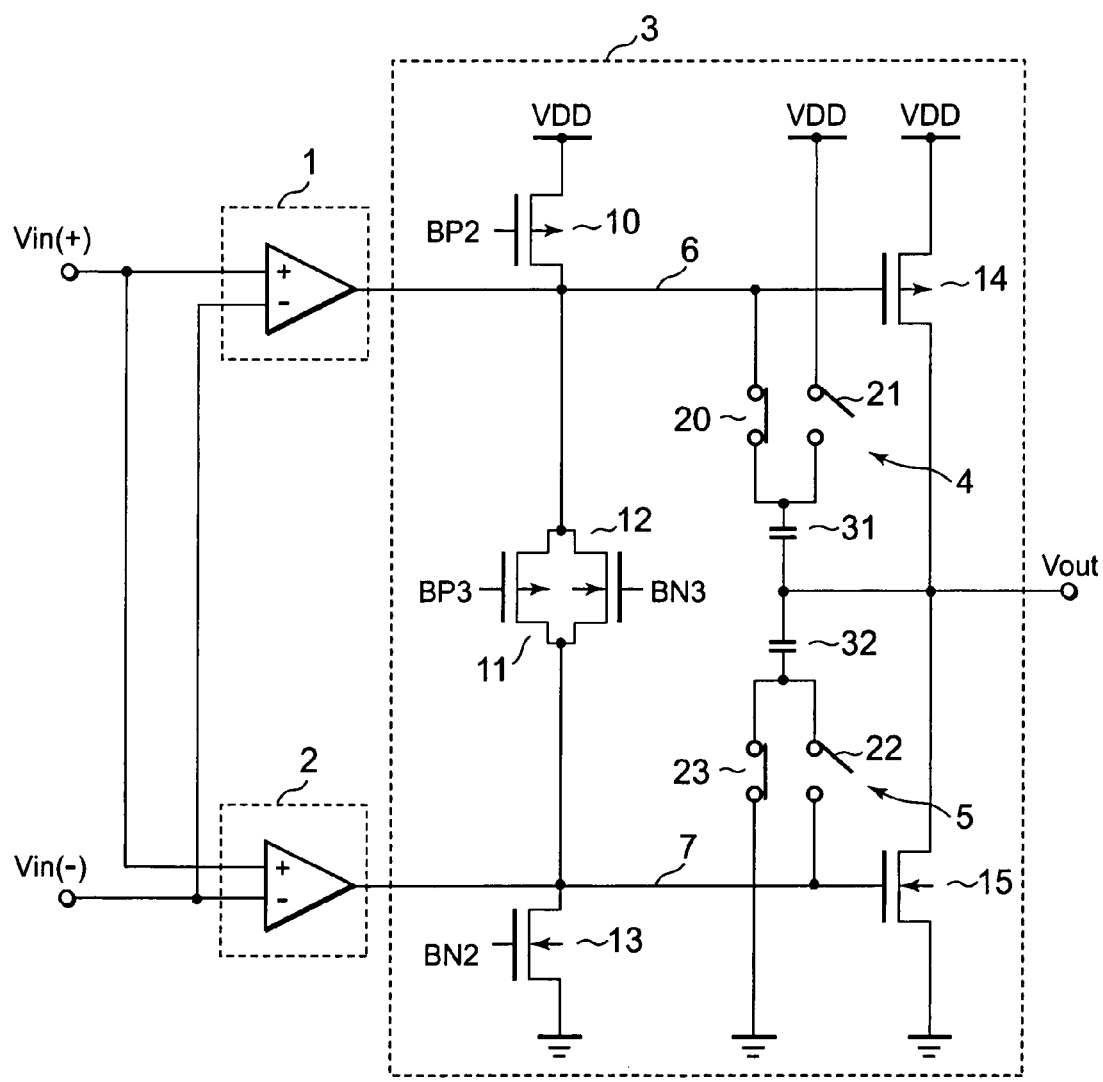
FIG. 1 is a configuration of an operational amplifier in a first embodiment.

Hereunder, an operational amplifier in a first embodiment of the present invention will be described with reference to FIG. 1. As shown in FIG. 1, the operational amplifier in this first embodiment has an N receiving differential amplifier 1 and a P receiving differential amplifier 2, and an AB class output circuit 3.

The N receiving differential amplifier 1 has an inverted input terminal (−) and a noninverted input terminal (+). As a concrete configuration, for example, as shown in the conventional one in FIG. 9, the operational amplifier may have a general configuration including a pair of N channel differential MOS transistors, a pair of current mirror type P channel load MOS transistors connected to the pair of N channel differential MOS transistors, an N channel constant current source MOS transistor for inputting an N channel differential bias voltage to the gates and supplying a constant current to the sources of the pair of the N channel differential MOS transistors respectively. An output terminal of the N receiving differential amplifier 1 is connected to the gate of the P channel output MOS transistor 14 of the AB class output circuit 3. The N receiving differential amplifier 1 outputs an inputted signal to the gate of the P channel output MOS transistor 14 of the AB class output circuit 3.

Figure 9:
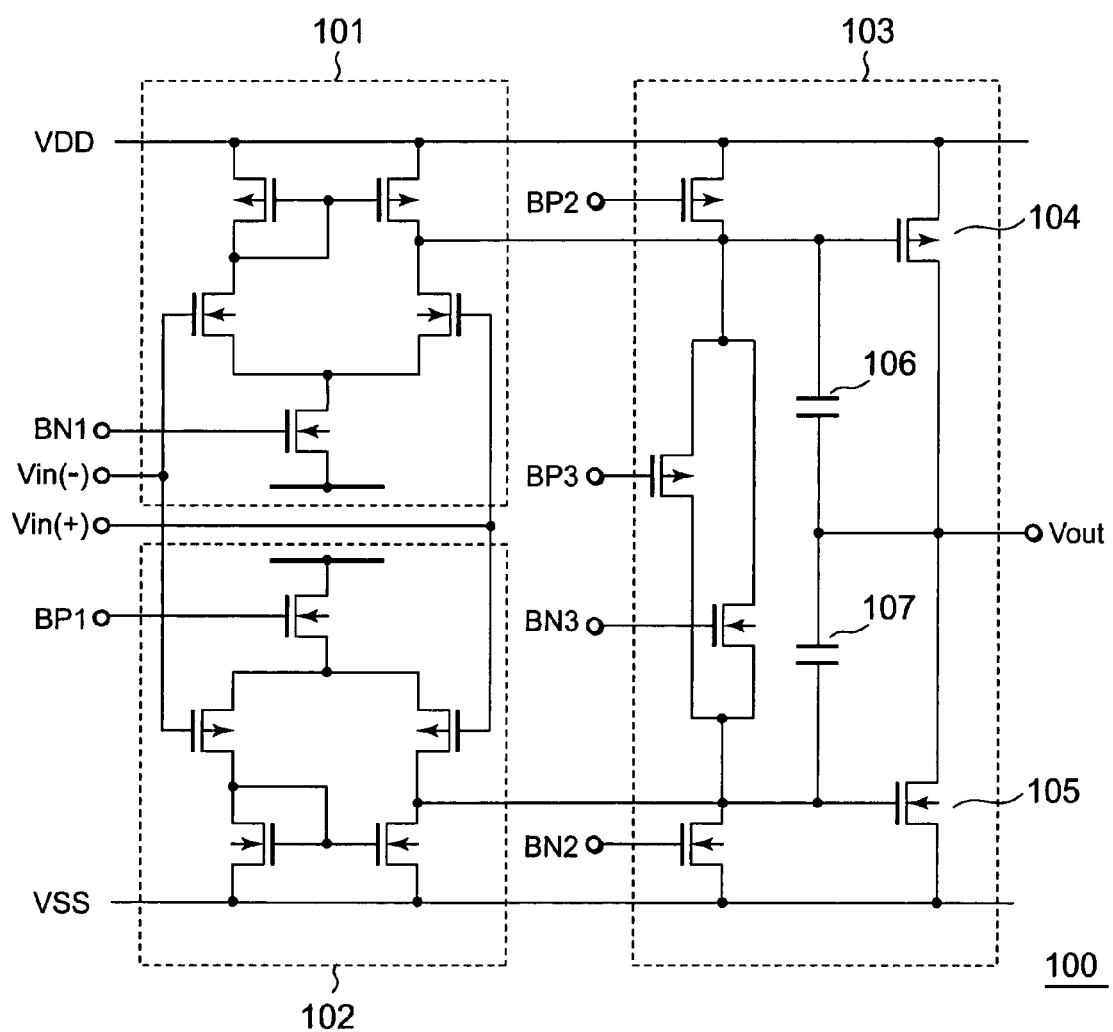
FIG. 9 is a configuration of a conventional operational amplifier.

The P receiving differential amplifier 2 has an inverted input terminal (−) and a noninverted input terminal (+). As a concrete configuration, the P receiving differential amplifier 2 may have a general configuration, for example, like the conventional example as shown in FIG. 9. In that case, the amplifier 2 comes to have a pair of P channel differential MOS transistors, a pair of current mirror type N channel load MOS transistors connected to the pair of P channel differential MOS transistors, a P channel constant current source MOS transistor for inputting a P channel differential bias voltage to the gates and supplying a constant current to the sources of the pair of P channel differential MOS transistors respectively. An output terminal of the P receiving differential amplifier 2 is connected, to the gate of the N channel output MOS transistor 15 of the AB class output circuit 3. The P receiving differential Amplifier 2 outputs an inputted signal to the gate of the N channel output MOS transistor 15 of the AB class output circuit 3.

The AB class output circuit 3 has a P channel constant current MOS transistor 10, an AB class amplification circuit 13, a P channel shift MOS transistor 11, an N channel shift MOS transistor 12, a P channel output MOS transistor 14, an N channel output MOS transistor 15 (hereinafter, to be abbreviated as MOS transistors 10 to 15 as needed), a first switching circuit 4, a second switching circuit 5, a first mirror capacity (first capacity element) 31, and a second mirror capacity (second capacity element) 32. The first switching circuit 4 has a first control switch 20 and a second control switch 21. The second switching circuit 5 has a third control switch 22 and a fourth control switch 23. The configuration is not limited only to that shown in FIG. 1; the configuration may be determined freely if it includes the control switches 20 to 23 and the mirror capacities 31 and 32 described above.

In the AB class output circuit in this first embodiment, the pair of mirror capacities 31 and 32 used for phase compensation are connected between each gate of the pair of P/N channel output MOS transistors 4 and 5 and the output terminal Vout. Consequently, the differential class AB amplifier 3 comes to have a favorable frequency characteristic.

In the AB amplifier 3, MOS transistors 10 to 13 are provided at the side of the N and P receiving differential amplifiers 1 and 2 respectively. The MOS transistor 10 is connected between an output line 6 of the N receiving differential amplifier 1 and a power supply terminal (first power supply potential) VDD. A P channel constant current bias voltage BP2 is inputted to the gate of the MOS transistor 10. The MOS transistor 13 is connected between an output line 7 of the P receiving differential amplifier 2 and a ground terminal (second power supply potential) GND. An N channel constant current bias voltage BN2 is inputted to the gate of the MOS transistor 13.

The MOS transistors 11 and 12 function as level shifters. The MOS transistors 11 and 12 are connected in parallel between the output lines 6 and 7 of the pair of N and P receiving differential amplifiers 1 and 2. A P channel constant current bias voltage BP3 is inputted to the gate of the MOS transistor 11. An N channel bias voltage BN3 is inputted to the gate of the MOS transistor 12.

In the AB class output circuit, the first and second switching circuits 4 and 5, as well as the first and second mirror capacities 31 and 32 are provided at the output side of the MOS transistors 10 to 13. The first mirror capacity 31 is provided between the output line 6 of the N receiving differential amplifier 1 and the power supply terminal VDD. In other words, one end of the first mirror capacity 31 is connected to the output line 6 of the N receiving differential amplifier 1 or to the power supply terminal VDD and the other end thereof is connected to the output terminal Vout. And the second mirror capacity 32 is provided between the output line 7 of the P receiving differential amplifier 2/the ground GND and the output terminal Vout. In other words, one end of the first mirror capacity 32 is connected to the output line 7 of the P receiving differential amplifier 2 or to the ground terminal GND and the other end thereof is connected to the output terminal Vout.

The first switching circuit 4 switches and connects one end of the first mirror capacity 31 to the output line 6 of the N receiving differential amplifier 1 or to the power supply terminal VDD. The first switching circuit 4 has first and second control switches 20 and 21. One end of the first control switch 20 is connected to the output line 6 of the N receiving differential amplifier 1 and the other end thereof is connected to one end of the first mirror capacity 31. One end of the second control switch 21 is connected to the power supply terminal VDD and the other end thereof is connected to one end of the first mirror capacity 31. Due to the switching operation of those control switches 20 and 21, the first switching circuit 4 connects one end of the first mirror capacity 31 to the output line 6 of the N receiving differential amplifier 1 or to the power supply terminal VDD.

The second switching circuit 5 switches and connects one end of the second mirror capacity 32 to the output line 7 of the P receiving differential amplifier 2 or to the ground terminal GND. The second switching circuit 5 has third and fourth control switches 22 and 23. One end of the third control switch 22 is connected to the output line 7 of the P receiving differential amplifier 2 and the other end thereof is connected to one end of the second mirror capacity 32. One end of the fourth control switch 23 is connected to the ground terminal GND and the other end thereof is connected to one end of the second mirror capacity 32. Due to the switching operation of those control switches 22 and 23, the second switching circuit 5 connects one end of the first mirror capacity 32 to the output line 7 of the P receiving differential amplifier 2 or to the ground terminal GND. The operation of those control switches will be described in detail later.

In the AB class output circuit 3, MOS transistors 14 and 15 are provided at the output side of the first and second switching circuits 4 and 5. One end of the main current path of each of the MOS transistors 14 and 15 is connected to a common node. The common node of the MOS transistors 14 and 15 is connected to the output terminal Vout. The gate of the MOS transistor 14 is connected to the output line 6 of the N receiving differential amplifier 1. One end of the main current path of the MOS transistor 14 is connected to the output terminal Vout and the other end thereof is connected to the power supply VDD. Consequently, the MOS transistor 14 is connected between the output terminal Vout and the power supply terminal VDD. The gate of the MOS transistor 15 is connected to the output line 7 of the P receiving differential amplifier 2. One end of the main current path of the MOS transistor 15 is connected to the output terminal Vout and the other end thereof is connected to the ground terminal GND. Consequently, the MOS transistor 15 is connected between the output terminal Vout and the ground terminal GND. In other words, the MOS transistors 14 and 15 are connected serially between the power supply terminal VDD and the ground terminal GND. The output terminal Vout is connected to a node provided between the MOS transistors 14 and 15.

Consequently, the first mirror capacity 31 is provided between the gate of the MOS transistor 14 and the output terminal Vout. And the second mirror capacity 32 is provided between the gate of the MOS transistor 15 and the output terminal Vout. The first switching circuit 4 connects one end of the first mirror capacity 31 to the power supply terminal VDD or to the gate of the MOS transistor 14. The second switching circuit 15 connects one end of the second mirror capacity 32 to the ground terminal GND or to the gate of the MOS transistor 15.

Figure 2:
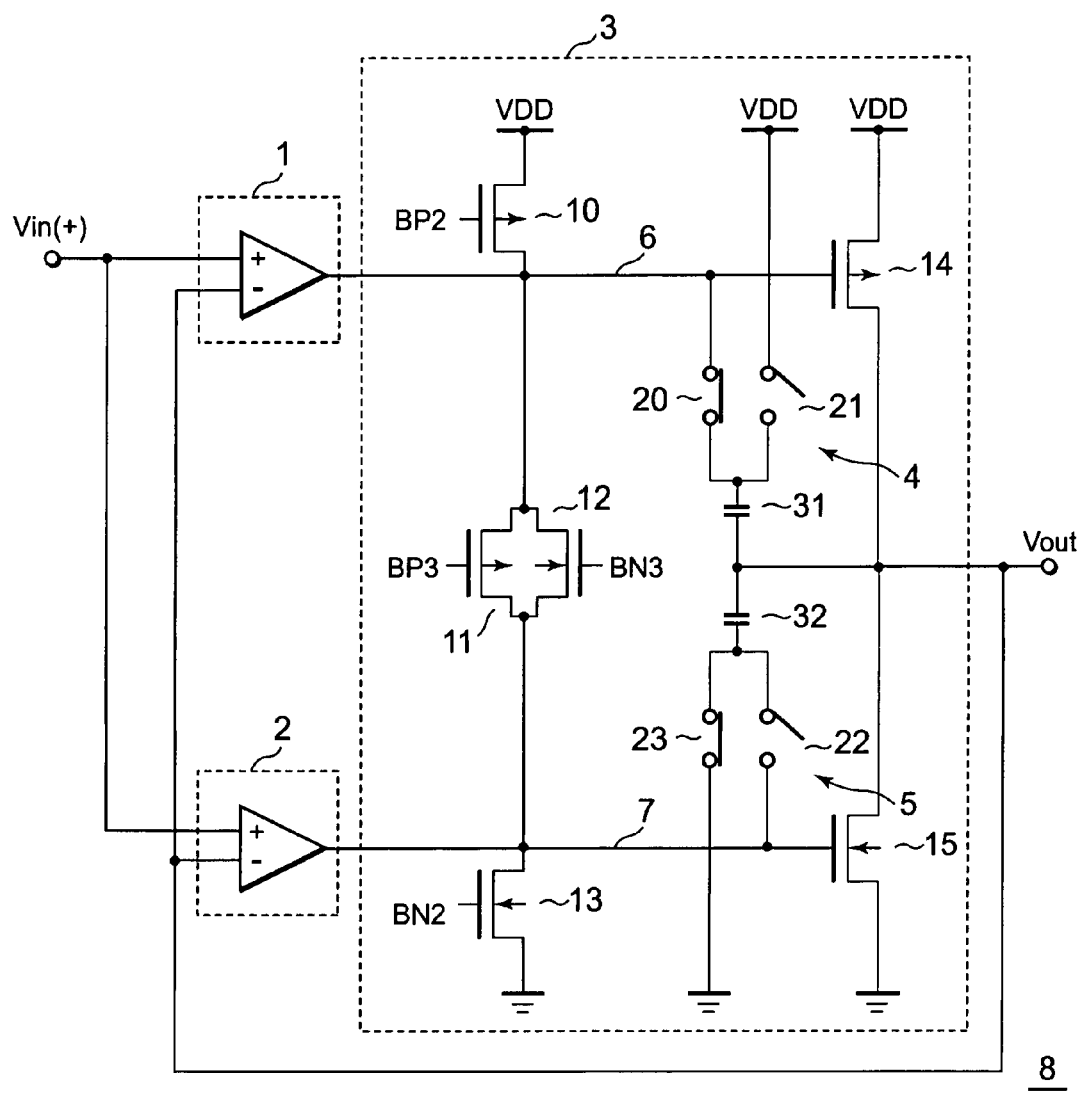
FIG. 2 is a configuration of a driving circuit in the first embodiment.

Next, a driving circuit shown in FIG. 2 will be described with reference to FIG. 2. The driving circuit is connected to the plurality of operational amplifiers shown in FIG. 1, which are subjected to voltage follower connection. FIG. 2 shows a configuration of the driving circuit in this embodiment. In FIG. 2, the same reference numerals represent the same configuration elements as those shown in FIG. 1, avoiding redundant description. As shown in FIG. 2, the output of the output terminal Vout is inputted to the inverted input terminals (−) of the N receiving differential amplifier 1 and P receiving differential amplifier 2 respectively. The driving circuit in this embodiment is used favorably to drive the data lines of a liquid crystal panel. Hereunder, this driving circuit is referred to as a data line driving circuit 8. Although only one operational amplifier is shown here, actually plural operational amplifiers are provided in parallel in accordance with the number of data lines of the subject liquid crystal panel. Although not shown in FIG. 2, the data line driving circuit 8 has a control circuit for controlling the control switches 20 to 23. The control circuit will be described in detail later.

A gradation voltage is inputted to the noninverted input terminals (+) of the N receiving differential amplifier 1 and the P receiving differential amplifier 2 from a Vin terminal (+), respectively. If a positive polarity gradation voltage is inputted to the Vin (+) terminal, the N receiving differential amplifier 1 lowers the gate voltage of the MOS transistor 14. On the other hand, the P receiving differential amplifier 2 lowers the gate voltage of the MOS transistor 15. Consequently, the ON resistance of the MOS transistor 14 falls and the ON resistance of the MOS transistor 15 rises. Thus the output terminal Vout outputs a positive polarity gradation voltage.

If a negative polarity is inputted to the Vin (+) terminal, the N receiving differential amplifier 1 raises the gate voltage of the MOS transistor 14. On the other hand, the P receiving differential amplifier 2 raises the gate voltage of the MOS transistor 15. Consequently, the ON resistance of the MOS transistor 14 rises and the ON resistance of the MOS transistor 15 falls. Thus the output terminal Vout outputs a negative polarity gradation voltage.

Figure 3:
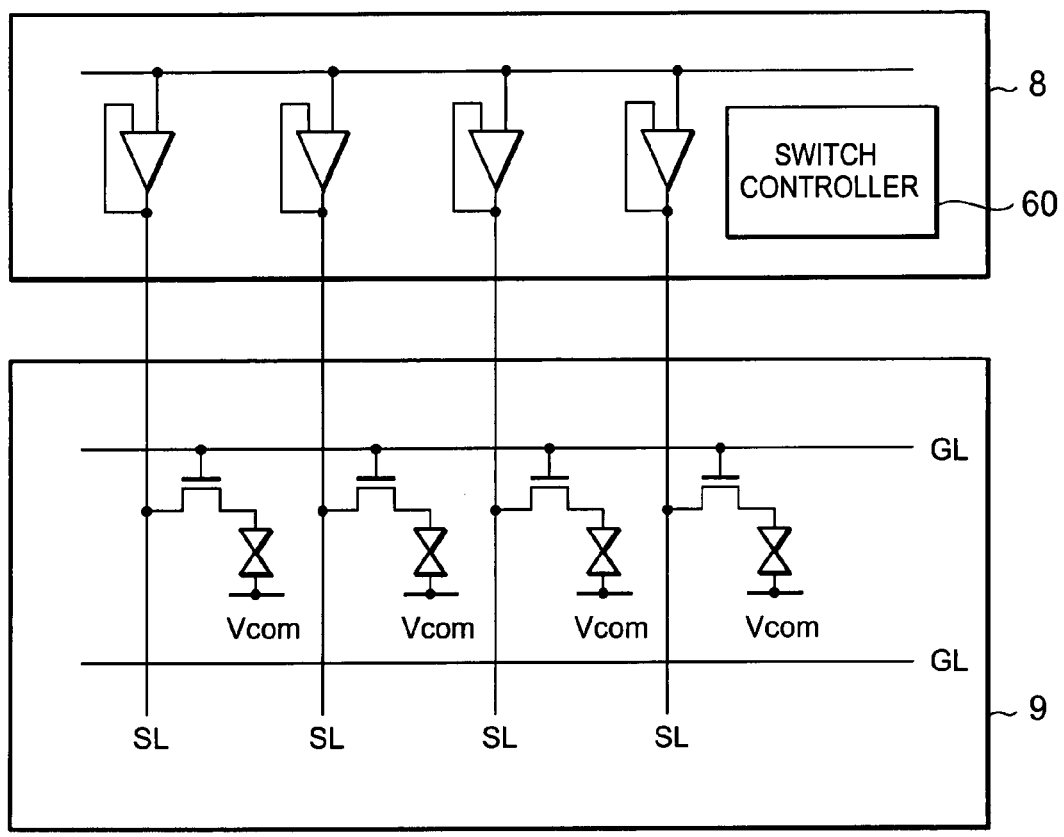
FIG. 3 is a configuration of a liquid crystal display that uses the driving circuit in the first embodiment.

Next, a description will be made for a configuration of a liquid crystal display that uses the driving circuit described in this embodiment with reference to FIG. 3. As shown in FIG. 3, the data line driving circuit 8 in this embodiment can be connected from external to the liquid crystal panel 9. The data line driving circuit 8 may also be formed on the substrate of the liquid crystal panel 9 connectably to all the data lines SL.

The liquid crystal panel 9 has a display area consisting of plural pixels. The liquid crystal panel 9 holds liquid crystal between a TFT (Thin Film Transistor) array substrate (not shown) and a counter substrate (not shown) disposed to face the TFT array substrate. The TFT array substrate has horizontal scanning lines GL and vertical data lines SL and a TFT is provided at each node of those scanning lines GL and data lines SL. And plural pixel electrodes are formed and disposed like a matrix between the scanning lines GL and the data lines SL. The TFT gate electrodes are connected to the scanning lines GL and the TFT source electrodes are connected to the data lines SL respectively. Consequently, one of the liquid crystal capacities held between the pixel electrodes and the common electrodes comes to be connected to the TFT drain electrodes (pixel electrodes) and the other liquid crystal capacity comes to be connected to the common electrodes.

Common electrodes, as well as R (red), G (green), and (B (blue) color filters are formed on the counter substrate. Actually, the common electrodes are transparent electrodes formed almost all over the counter substrate so as to face the pixel electrodes respectively. A scanning signal is supplied to each of the scanning lines GL and the scanning signal turns on all the TFTs connected to one selected scanning line GL simultaneously. And a gradation voltage is supplied to each data line SL and the pixel electrodes are charged according to the gradation voltage.

According to a potential difference between each pixel electrode in which a gradation voltage is written and each common electrode, the ordering of the liquid crystal between the pixel electrode and the common electrode changes. Consequently, the amount of the transmitted light irradiated from a back light (not shown) is controlled. Each pixel of the liquid crystal panel 9 displays in various colors matching with a shade of color in accordance with the transmitted light volume and any of the display RGB color displays. In a monochrome display mode, no color filters are required.

In this embodiment, a 2-line dot inversion driving method is adopted. In other words, the polarity of a display signal supplied to a pixel electrode is inverted for each data line SL alternately and inverted for every second scanning line GL. The polarity of each display signal is switched for each frame. The polarity status "positive(+)" means that the potential of a display signal supplied from a data line is over the common electrode potential that is a reference potential and the "negative(−)" status means that the display signal potential is under the common electrode potential.

The data line driving circuit 8 in this first embodiment outputs the above described gradation voltage according to each display signal supplied from external. As known widely, the data line driving circuit 8 has a shift register circuit, a latch circuit, a gradation voltage generation circuit, etc. They are omitted in FIGS. 2 and 3. In the case of inverted driving as described above, positive and negative polarity signals are inputted to the data line driving circuit 8 as display signals. Positive and negative polarity display signals may be a common signal and switched between positive and negative in a latch circuit.

Figure 4:
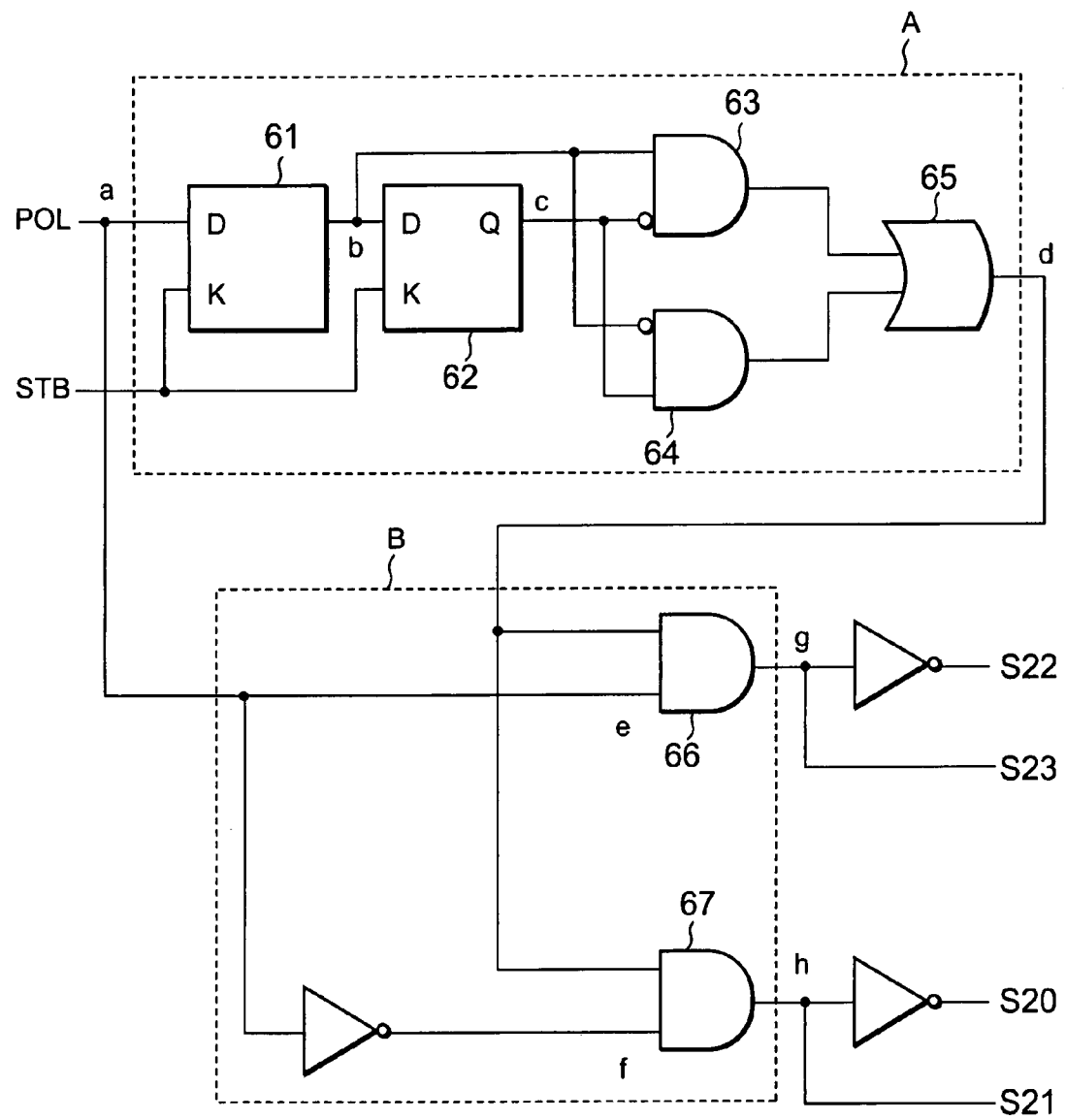
FIG. 4 is a configuration of a switch control circuit used for the driving circuit in the first embodiment.

As shown in FIG. 3, the data line driving circuit 8 in this first embodiment has a control circuit 60 for controlling the control switches 20 to 23. The control circuit 60 turns on/off the control switches 20 to 23 according to the inputted polarity inverted signal POL. Hereunder, a configuration of the control circuit 60 will be described with reference to FIG. 4. As shown in FIG. 4, the control circuit 60 has first and second flip-flop circuits 61 and 62, first and second AND circuits 63 and 64, an OR circuit 65, as well as third and fourth AND circuits 66 and 67. Here, a case in which a D type flip-flop circuit is employed will be described.

A polarity inverted signal POL (a) is inputted to an input terminal D of the first flip-flop circuit 61 and a strobe signal STB is inputted to an input terminal K thereof. An output (b) of the first flip-flop circuit 61 is inputted to an input terminal D of the second flip-flop circuit 62 and one of the two input terminals of the first AND circuit 63. And a strobe signal STB is inputted to an input terminal K of the second flip-flop circuit 62.

The output (b) of the first flip-flop circuit 61 is inverted and inputted to one of the two input terminals of the second AND circuit 64. An output (c) of the second flip-flop circuit 62 is inverted and inputted to the other input terminal of the first AND circuit 63. The output (c) of the second flip-flop circuit 62 is inputted to the other input terminal of the second AND circuit 64. The outputs of the first and second AND circuits 63 and 64 are inputted to an input terminal of the OR circuit 65 respectively.

An output (d) of the OR circuit 65 is inputted to the one of the two input terminals of each of the third and fourth AND circuits 66 and 67. A polarity inverted signal POL(e) is inputted to the other input terminal of the third AND circuit 66. A polarity inverted signal POL(f) inverted by an inverter is inputted to the other input terminal of the fourth AND circuit 67.

An output (g) of the third AND circuit 66 is inputted to the fourth control switch 23, then inverted by an inverter and inputted to the third control switch 22. An output (h) of the fourth AND circuit 67 is inputted to the second control switch 21, then inverted by an inverter and inputted to the first control switch 20.

A logic circuit denoted by a dotted line A in FIG. 4 outputs a signal (d) on the high level (1) when the polarity inverted signal POL is inverted. Another logic circuit denoted by a dotted line B in FIG. 4 has outputs of two systems (g) and (h). When the polarity inverted signal POL denotes one of logics, the logic circuit B fixes the output of one system and changes the output of the other system according to the output (d) of the logic circuit A. When the signal POL is on the high level, the logic circuit B keeps the output (h) in the previous period as is. Then the logic circuit B switches the output (g) between high level (1) and low level (0) according to the output (d) of the logic circuit A. On the other hand, when the signal POL is on the low level, the logic circuit B keeps the output (g) in the previous period as is. Then, the logic circuit B switches the output (h) between high level (1) and low level (0) according to the output (d) of the logic circuit A. The configuration of the control circuit 60 is not limited only to that described so far; it may be varied freely, of course.

Figure 5:
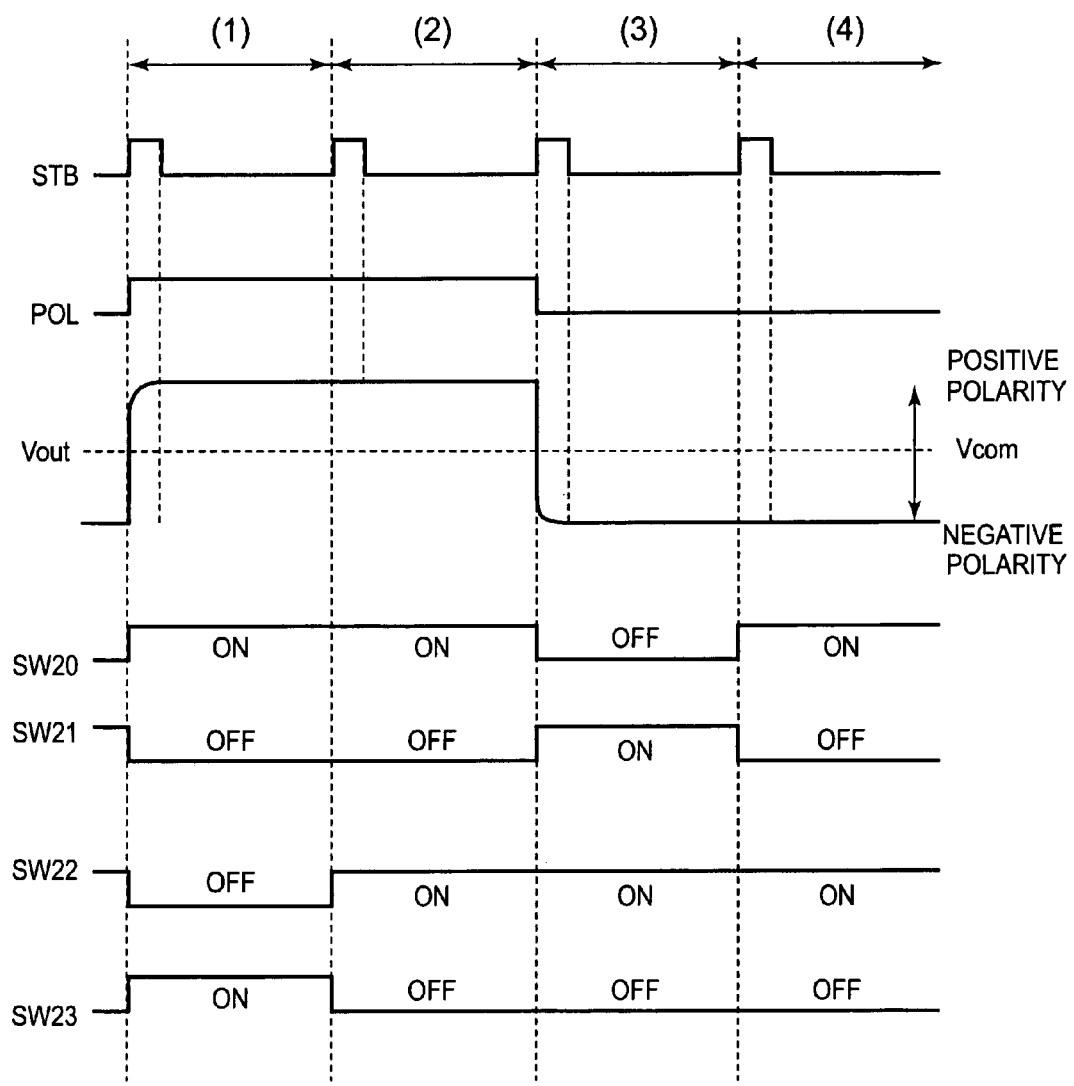
FIG. 5 is a diagram for describing an operation of the driving circuit in the first embodiment.

Next, the operation of the data line driving circuit 8 in this first embodiment will be described with reference to FIGS. 5 and 6. FIG. 5 shows a timing chart for describing the operation of the data line driving circuit 8. FIG. 6 shows a truth table of the signal at each of the points a to h of the control circuit 60 shown in FIG. 4. As shown in FIG. 5, the operation of the data line driving circuit 8 varies in cases as follows; (1) "polarity output is changed from negative to positive", (2) "positive polarity output is kept", (3) "polarity output is changed from negative to positive", and (4) "negative polarity output is kept". Each of the above cases will be described below. Here, it is assumed that a 2-line dot inverted driving method is adopted. Consequently, the polarity of the gradation voltage output from the operational amplifiers in the odd-numbered columns differs from that output from the operational amplifiers in the even-numbered columns. And each operational amplifier outputs a gradation voltage of which polarity is inverted for every second scanning line. In FIG. 5, each of the operational amplifiers in the odd-numbered columns outputs Vout.

(1) When Polarity Output is Changed from Negative to Positive

In the period (1) shown in FIG. 5, when the polarity inverted signal POL enters the high level at its rising time, a positive polarity gradation voltage is inputted to the noninverted input terminals (+) of both the N receiving differential amplifier 1 and the P receiving differential amplifier 2 in the odd-numbered columns. On the other hand, a negative polarity gradation voltage is inputted to the noninverted input terminals (+) of both the N receiving differential amplifier 1 and the P receiving differential amplifier 2 in the even-numbered columns.

When the signal POL rises and the strobe signal STB rises and enters the high level, the gate voltage of the P channel output MOS transistor 14 falls and its ON resistance is lowered. And the gate voltage of the N channel output MOS transistor 15 also falls, but its ON resistance rises. Consequently, the Vout voltage output from the operational amplifier rises. In other words, if an input to an operational amplifier is inverted from positive polarity to negative polarity, the polarity of the Vout voltage is inverted from negative to positive.

At that time, the control circuit functions as shown in FIG. 6 to turn on/off the control switches 20 to 23. And as shown in FIG. 6 (1), the logic circuit A in FIG. 4 outputs the signal (d) of high level (1) when the level of the signal POL is changed from low to high. Because the signal POL is on the high level (1) at that time, the output (h) for controlling the first and second control switches 20 and 21 is fixed on the low level (0) as it has been in the previous period. Consequently, the first control switch 20 is turned on and the second control switch 21 is turned off. The output line of the N receiving differential amplifier 1 is thus connected to one end of the first mirror capacity 31. And the power supply terminal VDD is disconnected from one end of the first mirror capacity 31.

On the other hand, the output (g) for controlling the third and fourth control switches 22 and 23 is switched between low level (0) and high level (1) according to the output of the logic circuit A. Consequently, the third control switch 22 is turned off and the fourth control switch 23 is turned on. As a result, the ground terminal GND is connected to one end of the second mirror capacity 32. And the output line of the P receiving differential amplifier 2 is disconnected from the second mirror capacity 32.

Because the third control switch is turned off such way, the gate of the N channel output MOS transistor 15 is disconnected from the output of the control switch 22. Consequently, the N channel output MOS transistor 15 can avoid sudden voltage rising of the Vout to be caused by the polarity inversion from negative to positive. In other words, when the Vout polarity is inverted from negative to positive, no charge goes to the second mirror capacity 32 from the output line 7. Consequently, the gate voltage of the N channel output MOS transistor 15 rises, thereby the ON resistance rising time is shortened. This is why it is possible to avoid the conventional problem that the Vout voltage rises suddenly at the time of polarity inversion from negative to positive, then the ON resistance of the P channel output MOS transistor 14 and the N channel output MOS transistor 15 is reduced at the same time, thereby a large through-current comes to flow.

Furthermore, when the second mirror capacity 32 is disconnected from the gate of the N channel output MOS transistor 15, the node of the second mirror capacity 32, having been connected to the gate of the N channel output MOS transistor 15, is not opened, but connected to the ground terminal GND. Consequently, it is possible to prevent a conventional problem that, when the second mirror capacity 32 is connected to the gate of the next time, the gate voltage becomes unstable.

(2) When Positive Polarity Output is Kept as is

As shown in FIG. 5 (2), if the signal POL is kept on the high level, a positive polarity gradation voltage is kept inputted to the noninverted input terminals (+) of both the N receiving differential amplifier 1 and the P receiving differential amplifier 2 in the odd-numbered columns. And a negative polarity gradation signal is kept inputted to the noninverted input terminals (+) of both the N receiving differential amplifier 1 and the P receiving differential amplifier 2 in the even-numbered columns.

At that time, just like the period (1), the gate voltage of the P channel output MOS transistor 14 falls and its ON resistance also falls. And the gate voltage of the N channel output MOS transistor 15 falls, but its ON resistance rises. Consequently, the output terminal Vout of the operational amplifier outputs a positive polarity gradation voltage. In other words, if an input to the operational amplifier is kept in positive polarity, the Vout voltage is kept in positive polarity.

At that time, as shown in FIG. 6 (2), the logic circuit A shown in FIG. 4 keeps the signal POL on the high level thereby outputting the low level (0) signal (d). At that time, the signal POL is on the high level (1), so that the output (h) for controlling the first and second control switches 20 and 21 is kept on the low level (0) in the previous (1) period. Consequently, the first and second control switches 20 and 21 go into the same status as that in the (1) period. In other words, the first control switch 20 is turned on and the second control switch 21 is turned off. This means that the output line of the N receiving differential amplifier 1 is connected to one end of the first mirror capacity 31 and the power supply terminal VDD is disconnected from one end of the first mirror capacity 31.

On the other hand, the output (g) for controlling the third and fourth control switches 22 and 23 is switched between high level (1) and low level (0) according to the output (d) of the logic circuit A. Consequently, the third and fourth control switches 22 and 23 go into the counter status of the (1) period. In other words, immediately after the strobe signal STB rises, the third control switch 22 is turned on and the fourth control switch 23 is turned off. This means that the output line of the P receiving differential amplifier 2 is connected to one end of the second mirror capacity 32 and the ground terminal GND is disconnected from the second mirror capacity 32.

If the input to the operational amplifier is kept as is such way, the Vout output voltage never change suddenly. Consequently, the gate voltage of both the P channel output MOS transistor 14 and the N channel output MOS transistor 15 is kept as is. Consequently, the output line of the N receiving differential amplifier 1 can be connected to the first mirror capacity 31 and the output line of the P receiving differential amplifier 2 can be connected to the second mirror capacity 32 respectively to make the same phase compensation as the conventional one.

(3) When Polarity Output is Changed from Positive to Negative

In the period (3) shown in FIG. 5, if the signal POL falls and goes into the low level, a negative polarity gradation voltage is inputted to the noninverted input terminals (+) of both the N receiving differential amplifier 1 and the P receiving differential amplifier 2 of the operational amplifiers in the odd-numbered columns. And a positive polarity gradation signal is inputted to the noninverted input terminals (+) of the N receiving differential amplifier 1 and the P receiving differential amplifier 2 of the operational amplifiers in the even-numbered columns.

If the signal POL and the strobe signal STB rise, then the signal STB goes into the high level, the gate voltage of the N channel output MOS transistor 15 rises and its ON resistance is lowered. The gate voltage of the P channel output MOS transistor 14 also rises and its ON resistance rises. Consequently, the Vout output voltage from each operational amplifier falls. In other words, when the input to the operational amplifier is inverted from positive polarity to negative polarity, the Vout voltage polarity is also inverted from positive to negative.

At that time, as shown in FIG. 6 (3), the logic circuit A in FIG. 4 outputs a high level (1) signal (d) when the level of the signal POL is switched from high to low. At that time, because the signal POL is on the low level (0), the output (g) for controlling the third and fourth control signals 22 and 23 is fixed on the low level (0) in the previous (2) period. Consequently, the third and fourth control switches 22 and 23 goes into the same status as that of the (2) period. This means that when the strobe signal STB rises, the third control switch 22 is turned on and the fourth control switch 23 is turned off. This also means that the output line of the P receiving differential amplifier 2 is connected to one end of the second mirror capacity 32. And the ground terminal GND is disconnected from the second mirror capacity 32.

On the other hand, the level of the output (h) for controlling the first and second control switches 20 and 21 is changed from high (1) to low (0) according to the output (d) of the logic circuit A. Consequently, the first and second control switches 20 and 21 go into the counter status of the (2) period. In other words, when the strobe signal STB rises, the first control switch 20 is turned off and the second control signals 21 is turned on. This means that the power supply terminal VDD is connected to one end of the first mirror capacity 31 and the output line of the N receiving differential amplifier 1 is disconnected from one end of the first mirror capacity 31.

Because the first control switch 20 is turned off such way, the gate of the P channel output MOS transistor 14 is disconnected from the output. Consequently, the P channel output MOS transistor 14 can avoid a sudden voltage drop of the Vout to be caused by the polarity inversion from positive to negative. This means that when the Vout polarity is inverted from positive to negative, no charge goes to the first mirror capacity 31. Consequently, the gate voltage of the P channel output MOS transistor 14 falls and its ON resistance rising time can be shortened. This is why it is possible to avoid the conventional problem that the ON resistance of both the P channel output MOS transistor 14 and the N channel output MOS transistor 15 is lowered simultaneously due to a sudden Vout voltage drop to be caused by polarity inversion from positive to negative, thereby a large through-current comes to flow.

When the first mirror capacity 31 is disconnected from the gate of the P channel output MOS transistor 14, the node to which the gate of the first mirror gate 31 is connected is not opened, but connected to the power supply terminal VDD. Consequently, it is possible to prevent a conventional problem that the gate potential becomes unstable, thereby causing an operation error when the first mirror capacity 31 is connected to the gate of the P channel output MOS transistor 14 next time.

(4) When Negative Polarity Output is Kept as is

As shown in FIG. 5 (4) period, if the signal POL is kept on the low level, a negative polarity gradation voltage is kept inputted to the noninverted input terminals (+) of the N receiving differential amplifier 1 and the P receiving differential amplifier 2 of the operational amplifiers in the odd-numbered columns. And a positive polarity gradation voltage is kept inputted to the noninverted input terminals (+) of the N receiving differential amplifier 1 and the P receiving differential amplifier 2 of the operational amplifiers in the even-numbered columns.

At that time, if the strobe signal STB rises and goes into the high level, the gate voltage of the N channel output MOS transistor 15 rises and the ON resistance of the N channel output MOS transistor 15 falls just like in the (3) period. At that time, the gate voltage of the P channel output MOS transistor 14 and its ON resistance also rise. Consequently, each of the operational amplifiers outputs a negative polarity gradation voltage through the output terminal Vout. In other words, if the input to the operational amplifier is kept at the negative polarity, the Vout voltage is also kept at the negative polarity.

At that time, as shown in FIG. 6 (4), the logic circuit A shown in FIG. 4 outputs a low level (0) signal (d), since the signal POL is kept on the low level. At that time, because the signal POL is on the low level (0), the output (g) for controlling the third and fourth control switches 22 and 23 is fixed on the low level (0) in the previous period (3). Consequently, the third and fourth control switches 22 and 23 go into the same status as that in the period (3). In other words, when the strobe signal STB rises, the third control switch 22 is turned on and the fourth control switch 23 is turned off. This means that the output line of the P receiving differential amplifier 2 is connected to one end of the second mirror capacity 32 and the ground terminal GND is disconnected from the second mirror capacity 32.

On the other hand, the level of the output (h) for controlling the first and second control switches 20 and 21 is switched from high (1) to low (0) according to the output (d) of the logic circuit A. Consequently, the first and second control switches 20 and 21 go into the counter status of that of the (3) period. In other words, the first control switch 20 is turned on and the second control switch 21 is turned off. This means that the output line of the N receiving differential amplifier 1 is connected to one end of the first mirror capacity 31 and the power supply terminal VDD is disconnected from one end of the first mirror capacity 31.

Thus the output Vout never makes a sudden change as long as there is no change in the input to the operational amplifier. Consequently, the gate voltage of the P channel output MOS transistor 14 and the N channel output MOS transistor 15 is kept as is. Consequently, it is possible to make the same phase compensation as the conventional one by connecting the output line of the N receiving differential amplifier 1 to the first mirror capacity 31 and the output line of the P receiving differential amplifier 2 to the second mirror capacity 32 respectively.

As described above, according to the present invention, one end of the first mirror capacity 31 can be switched and connected to the output line 6 of the N receiving differential amplifier 1 or to the power supply terminal VDD with use of the first switching circuit 4. And one end of the second mirror capacity 32 can be switched and connected to the output line 7 of the P receiving differential amplifier 2 or to the ground terminal GND with use of the second switching circuit 5. Consequently, it is possible to suppress an increase of the through-current to occur when the polarity of the output gradation voltage is inverted. And by suppressing the through-current such way, the through-rate of each operational amplifier can be prevented from lowering.

Second Embodiment

Figure 7:
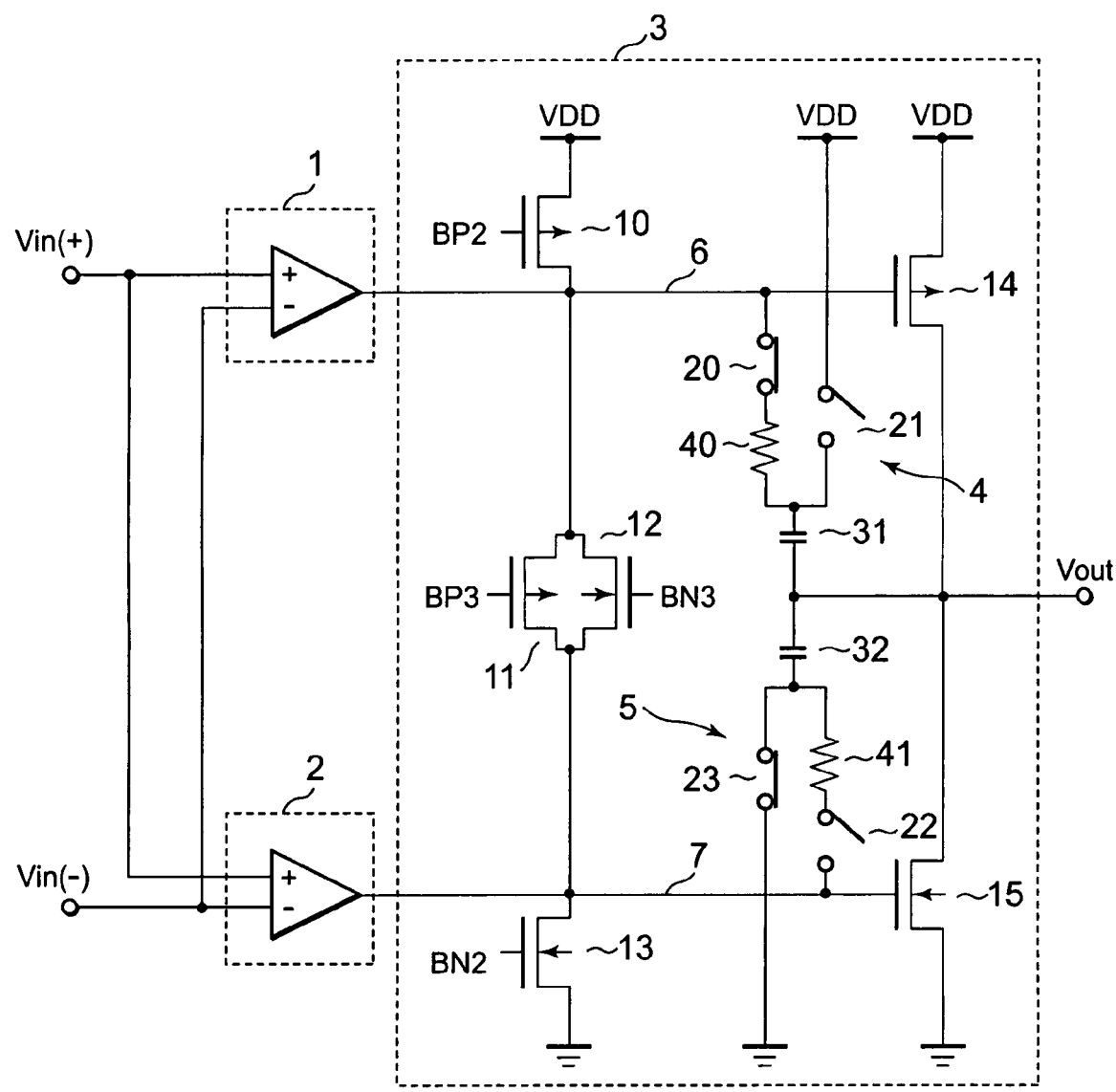
FIG. 7 is a configuration of an operational amplifier in a second embodiment.

Next, a description will be made for an operational amplifier in a second embodiment of the present invention with reference to FIG. 7. FIG. 7 is a diagram for describing another configuration of the operational amplifier in this second embodiment of the present invention. In FIG. 7, the same reference numerals represent the same configuration items as those shown in FIG. 1, avoiding redundant description.

As shown in FIG. 7, the operational amplifier in this second embodiment has a N receiving differential amplifier 1, a P receiving differential amplifier 2, and an AB class output circuit 3. The AB class output circuit 3 consists of MOS transistors 10 to 15, control switches 20 to 23, mirror capacities 31 and 32, and zero-point erasing resistors 40 and 41. This second embodiment differs from the first embodiment shown in FIG. 1 only in that first and second zero-point erasing resistors 41 and 42 are provided.

The zero-point erasing resistors 41 and 42 are provided to make the time constant greater and improve the frequency characteristic. The first zero-point erasing resistor 41 is provided between the first control switch 20 and the first mirror capacity 31. The second zero-point erasing resistor 42 is provided between the third control switch 22 and the second mirror capacity 32. In case where the control switches 20 to 23, the mirror capacities 31 and 32, and the zero-point erasing resistors 40 and 41 are included, the configuration of other items such as the MOS transistors 10 to 15 may not be limited only to the configuration of the operational amplifier in this second embodiment shown in FIG. 7. Furthermore, the disposition places of the first control switch 20 and the zero-point erasing resistor 40 connected serially, as well as the third control switch 22 and the first zero-point erasing resistor 41 connected serially may be exchanged respectively in the configuration shown in FIG. 7.

The operations of the control switches 20 to 23 are as shown in FIG. 5 and they are the same as those described in the first embodiment. Even in this case, as described above, the through-current is suppressed and the through-rate of the operational amplifier is prevented from lowering.

Third Embodiment

Figure 8:
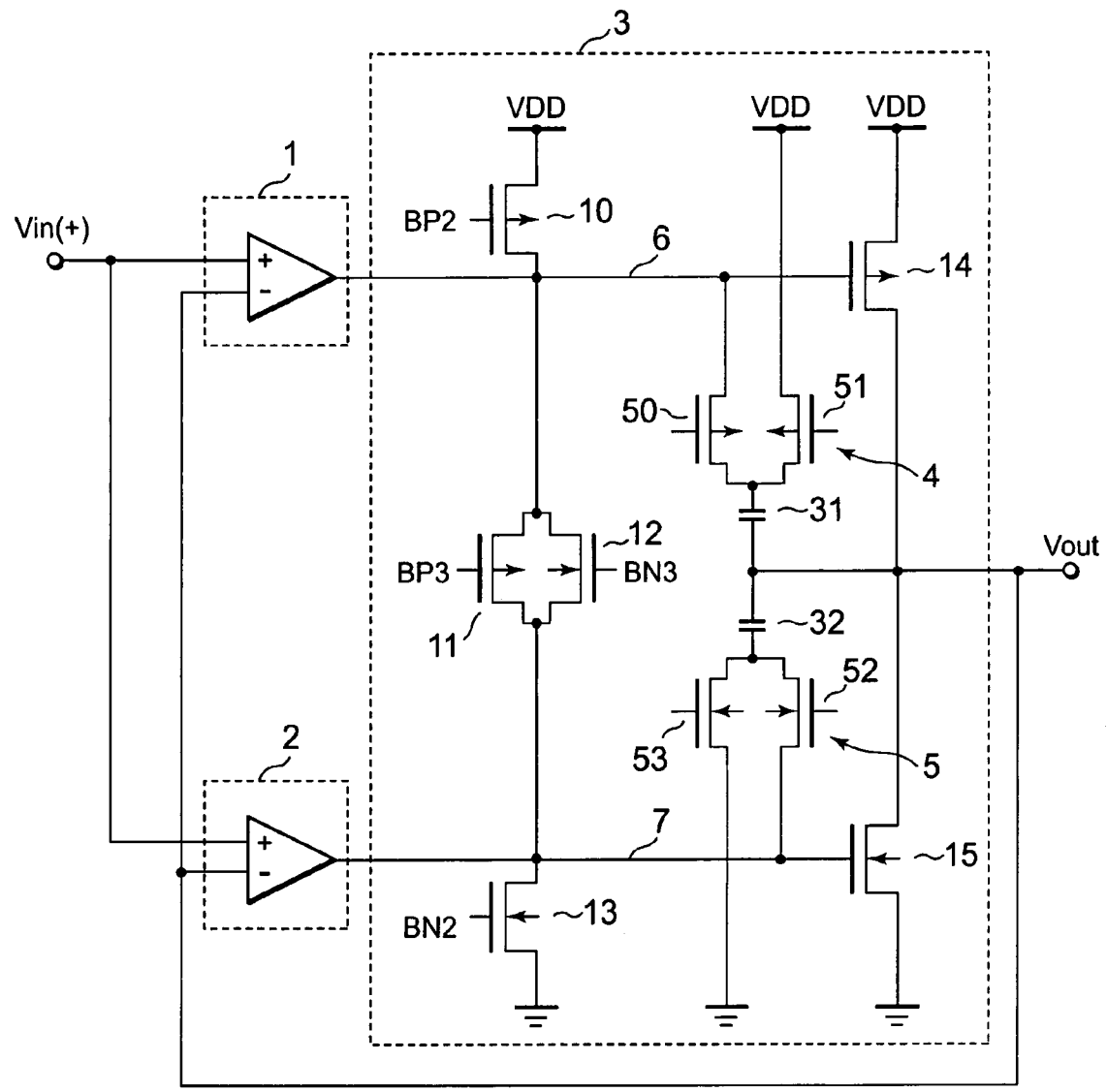
FIG. 8 is a configuration of an operational amplifier in a third embodiment.

Next, an operational amplifier in a third embodiment of the present invention will be described with reference to FIG. 8. FIG. 8 shows a configuration of the operational amplifier in this third embodiment of the present invention. In FIG. 8, the same reference numerals represent the same component elements as those shown in FIG. 1, avoiding redundant description.

As shown in FIG. 8, the operational amplifier in this third embodiment has an N receiving differential amplifier 1, a P receiving differential amplifier 2, and an AB class output circuit 3 just like the first and second embodiments described above. The AB class output circuit 3 consists of MOS transistors 10 to 15, control switches 20 to 23, mirror capacities 31 and 32, and control transistors 50 to 53. In this third embodiment, the control switches 20 to 23 employed in the first and second embodiments shown in FIG. 1 are replaced with the control transistors 50 to 53. This is only a difference between this third embodiment and other first and second embodiments.

The first switching circuit 4 has first and second control transistors 50 and 52. One end of the first control transistor 50 is connected to an output line 6 of the N receiving differential amplifier 1 and the other end thereof is connected to one end of the first mirror capacity 31. One end of the second control transistor 51 is connected to a power supply terminal VDD and the other end thereof is connected to one end of the first mirror capacity 31. Those control transistors 50 and 51 are switched to enable the switching circuit 4 to connect one end of the first mirror capacity 31 to the output line 6 of the N receiving differential amplifier 1 or to the power supply terminal VDD. Consequently, the first control transistor 50 functions equivalently to the first control switch 20 and the second control transistor 51 functions equivalently to the second control switch 21.

The second switching circuit 5 has a third control transistor 52 and a fourth control transistor 53. One end of the third control transistor 52 is connected to an output line 7 of the P receiving differential amplifier 2 and the other end thereof is connected to one end of the first mirror capacity 32. One end of the second control transistor 53 is connected to a ground terminal GND and the other end thereof is connected to one end of the second mirror capacity 32. Consequently, the third control transistor 52 functions equivalently to the third control switch 22 and the fourth control transistor 53 functions equivalently to the fourth control switch 23.

Because the control switches 20 to 23 are replaced with the control transistors 50 to 53, the number of time constants can be increased, thereby the frequency characteristic can be improved. Transistors having high ON resistance respectively should preferably be used as the first and third control transistors 50 and 52 while transistors having low ON resistance respectively should preferably be used as the second and fourth control transistors 51 and 53. This is because the first control transistor 20 and the first zero-point erasing resistor 40 in the second embodiment can be replaced with the first control transistor 50 and the third control switch 22 and the second zero-point erasing resistor 41 can be replaced with the third control transistor 52. After those replacements, the frequency characteristic of the operational amplifiers can further be improved.

The operations of the control transistors 50 to 53 are the same as those shown in FIG. 5 in the first embodiment. As described above, also in this case, the through-current is suppressed and the through-rate of each operational amplifier is prevented from lowering.

As described above, according to the present invention, a control switch is provided between a mirror capacity and the gate of an output transistor so that the mirror capacity is separated from the gate of a transistor of which ON resistance should not be lowered at the time of polarity inversion of the output voltage. Thus the gate voltage is kept constant and the through-current is reduced, thereby the through-rate of the operational amplifier can be improved.

Furthermore, another control switch is provided at a terminal of the mirror capacity connected to the gate of each output transistor. When the gate of the transistor is separated from the mirror capacity, the mirror capacity connected to a P channel transistor is connected to a power supply while the mirror capacity connected to an N channel transistor is connected to a ground terminal. Consequently, when the output polarity is inverted next time and the gate of the disconnected transistor is connected to the mirror capacity again, it is possible to prevent the conventional problem that the charge accumulated in the mirror capacity causes the gate voltage to be changed and the system operation to become unstable.

Thus the operational amplifier according to the present invention can be used favorably as an output circuit for driving the liquid crystal subjected to voltage-follower connection. And because the through-current is reduced as described above, heat generation and electromagnetic wave interference (EMI) of chips can be reduced.

It is apparent that the present invention is not limited to the above embodiments, but may be modified and changed without departing from the scope and spirit of the invention.

What is claimed is:

1. An amplifier, comprising:
    first and second output transistors connected serially between a first power supply potential and a second power supply potential;
    an output terminal connected to a node between said first and second transistors;
    a first capacity element including a first end coupled to said output terminal;
    a second capacity element including a first end coupled to said output terminal;
    a first switching circuit for connecting a second end of said first capacity element to said first power supply potential or to said control terminal of said first transistor; and
    a second switching circuit for connecting a second end of said second capacity element to said second power supply potential or to said control terminal of said second transistor.

2. The amplifier as claimed in claim 1,
    wherein said first switching circuit includes:
    a first control switch provided between said second end of said first capacity element and said control terminal of said first transistor; and
    a second control switch provided between said second end of said first capacity element and said first power supply potential; and
    wherein said second switching circuit includes a third control switch provided between said second end of said second capacity element and said control terminal of said second transistor; and a fourth control switch provided between said second end of said second capacity element and said second power supply potential.

3. The amplifier as claimed in claim 2, wherein said amplifier further includes:
    a first resistance element connected between said first control switch and said second end of said first capacity element; and
    a second resistance element connected between said third control switch and said second end of said second capacity element.

4. The amplifier as claimed in claim 2,
    wherein each of said first to fourth control switches comprises a MOS transistor.

5. The amplifier as claimed in claim 2,
    wherein ON resistance of said first and third control switches is larger than that of said second and fourth control switches.

6. The amplifier as claimed in claim 1,
    wherein said amplifier further includes:
    a first differential amplifier connected to said control terminal of said first transistor; and
    a second differential amplifier connected to said control terminal of said second transistor.

7. The amplifier as claimed in claim 1,
    wherein a circuit that includes said first and second output transistors, said first and second capacity elements, and said first and second switching circuits comprise an AB class output circuit.

8. A driving circuit, comprising:
    an amplifier according to claim 1; and
    a control circuit for controlling said first and second switching circuits according to an inputted polarity inverted signal.

9. A driving circuit, comprising:
    a plurality of operational amplifiers, each of said operational amplifiers configured with a voltage follower connection and including a pair of differential amplifiers and an amplification circuit, and
    wherein said amplification circuit includes:
    first and second output transistors connected serially between a first power supply potential and a second power supply potential, a control terminal of said first output transistor being connected to one of said operational amplifiers, a control terminal of said second output transistor being connected to the other of said operational amplifiers;
    an output terminal connected to a node provided between said first and second transistors;
    a first capacity element having a first end connected to said output terminal;
    a second capacity element having a first end connected to said output terminal;
    a first switching circuit connecting a second end of said first capacity element to said first power supply potential or to said control terminal of said first transistor; and
    a second switching circuit connecting a second end of said second capacity element to said second power supply potential or to said control terminal of said second transistor.

10. The driving circuit as claimed in claim 9,
    wherein said first switching circuit connects said second end of said first capacity element to said first power supply potential and said second switching circuit connects said second end of said second capacity element to said control terminal of said second transistor when polarity of an output of said output terminal is inverted from negative to positive; and wherein said first switching circuit connects said second end of said first capacity element to said control terminal of said first transistor and said second switching circuit connects said second end of said second capacity element to said second power supply potential when polarity of an output of said output terminal is inverted from positive to negative.

11. The driving circuit as claimed in claim 9,
wherein said first switching circuit includes a first control switch provided between said second end of said first capacity element and said control terminal of said first transistor; and a second control switch provided between said second end of said first capacity element and said first power supply potential; and wherein said second switching circuit includes a third control switch provided between said second end of said second capacity element and said control terminal of said second transistor; and a fourth control switch provided between said second end of said second capacity element and said second power supply potential.

12. The driving circuit as claimed in claim 9,
wherein said driving circuit further includes:
a first resistance element connected between said first control switch and said second end of said first capacity element; and
a second resistance element connected between said third control switch and said second end of said second capacity element.

13. The driving circuit as claimed in claim 11,
wherein each of said first to fourth control switches comprises a MOS transistor.

14. The driving circuit as claimed in claim 13,
wherein ON resistance of said first and third control switches is larger than that of said second and fourth control switches.

15. The driving circuit as claimed in claim 9,
wherein said amplification circuit comprises an AB class amplifier.

16. The driving circuit as claimed in claim 9;
wherein said driving circuit includes a control circuit that controls said control switches according to an input polarity inverted signal respectively.

17. An amplifier, comprising:
first and second output transistors connected serially between a first power supply potential and a second power supply potential;
an output terminal connected to a node provided between said first and second transistor;
a first capacity element provided between a control terminal of said first transistor and said output terminal,
wherein said first capacity element and said control terminal of said first transistor are electrically disconnected from each other when an output voltage of said output terminal is changed from a first level to a second level; and
a second capacity element provided between a control terminal of said second transistor and said output terminal;
wherein said second capacity element and said control terminal of said second transistor are electrically disconnected from each other when an output voltage of said output terminal is changed from said second level to said first level.

18. The amplifier as claimed in claim 17, wherein said first capacity element is electrically connected to said first power supply potential when an output voltage of said output terminal is changed from said first level to said second level.

19. The amplifier as claimed in claim 18, wherein said second capacity element is electrically connected to said second power supply potential when an output voltage of said output terminal is changed from said second level to said first level.

* * * * *